US009885954B2

(12) United States Patent
Lee et al.

(10) Patent No.: US 9,885,954 B2
(45) Date of Patent: Feb. 6, 2018

(54) PHOTOSENSITIVE RESIN COMPOSITION AND DISPLAY DEVICE USING THE SAME

(71) Applicant: Samsung Display Co., Ltd., Yongin-si, Gyeonggi-do (KR)

(72) Inventors: Baek Hee Lee, Yongin-si (KR); Young Min Kim, Asan-si (KR); Min Ki Nam, Anseong-si (KR); Hae Il Park, Seoul (KR); Seon-Tae Yoon, Seoul (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 5 days.

(21) Appl. No.: 15/050,250

(22) Filed: Feb. 22, 2016

(65) Prior Publication Data
US 2017/0075215 A1 Mar. 16, 2017

(30) Foreign Application Priority Data
Sep. 11, 2015 (KR) .................. 10-2015-0128864

(51) Int. Cl.
*G02F 1/1333* (2006.01)
*G03F 7/00* (2006.01)
*G02F 1/1368* (2006.01)
*G02F 1/1335* (2006.01)
*G03F 7/004* (2006.01)
*G03F 7/031* (2006.01)

(52) U.S. Cl.
CPC .......... *G03F 7/0007* (2013.01); *G02F 1/1368* (2013.01); *G02F 1/133377* (2013.01); *G02F 1/133528* (2013.01); *G03F 7/0047* (2013.01); *G03F 7/031* (2013.01); *G02F 2001/133614* (2013.01)

(58) Field of Classification Search
CPC ................. G02F 1/13337; G02F 2001/133614
See application file for complete search history.

(56) References Cited

U.S. PATENT DOCUMENTS

| 7,649,594 B2 | 1/2010 | Kim et al. | |
| 2010/0079704 A1* | 4/2010 | Cho .................. | G02F 1/133617 349/71 |
| 2013/0063917 A1* | 3/2013 | Choi ..................... | H01L 21/563 361/771 |
| 2014/0160395 A1* | 6/2014 | Park ................... | G02B 27/2214 349/61 |

FOREIGN PATENT DOCUMENTS

| JP | 2000-38489 A | 2/2000 |
| KR | 10-2010-0053409 A | 5/2010 |
| KR | 10-2012-0007780 A | 1/2012 |
| WO | WO 2010/095140 A2 | 8/2010 |

OTHER PUBLICATIONS

Products—Qlight Nanotech, URL—".pdf http://qlightnano.com/products/", May 11, 2015, pp. 1-3.

* cited by examiner

*Primary Examiner* — Kendrick Hsu
(74) *Attorney, Agent, or Firm* — Knobbe, Martens, Olson & Bear, LLP

(57) ABSTRACT

A photosensitive resin composition according to an exemplary embodiment of the present invention includes: a nanophosphor; a photo-polymerization initiator including an acetophenone-based initiator; and a photo-polymerization compound, wherein the photo-polymerization initiator further includes at least one among a thioxanthone-based initiator, an oxime-based initiator, and a benzophenone-based initiator.

14 Claims, 14 Drawing Sheets

PHOTOSENSITIVE RESIN COMPOSITION AND DISPLAY DEVICE USING THE SAME

CROSS-REFERENCE TO RELATED APPLICATION

Any and all applications for which a foreign or domestic priority claim is identified in the Application Data Sheet as filed with the present application are hereby incorporated by reference under 37 CFR 1.57. This application claims priority to and the benefit of Korean Patent Application No. 10-2015-0128864 filed in the Korean Intellectual Property Office on Sep. 11, 2015, the entire contents of which are incorporated herein by reference.

BACKGROUND

Field

The present disclosure relates to a photosensitive resin composition and a display device including the same.

Description of the Related Technology

A color filter is used in a liquid crystal display and an optical filter, and is manufactured by coating a minute region colored with three colors or more on an element or a transparent substrate The color filter may be generally formed by a pigment dispersion method.

A colored photosensitive resin composition used to manufacture the color filter generally includes a photo-polymerization compound, a photo-polymerization initiator, a pigment, a solvent, and other additives. In this case, the pigment has a limitation in securing an excellent luminance characteristic, and recently, the luminance characteristic has been improved by using a quantum dot or a phosphor as well as the pigment.

However, recently, a color filter in which luminance and heat resistance are excellent has been required depending on high quality specifications, however photo-efficiency or color reproducibility may be decreased by heat generated in the patterning process.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

The present disclosure provides a photosensitive resin composition having excellent exposure sensitivity and optical efficiency by using a predetermined initiator in the photosensitive resin composition including a nanophosphor.

A photosensitive resin composition according to an exemplary embodiment of the present disclosure includes: a nanophosphor; a photo-polymerization initiator including an acetophenone-based initiator; and a photo-polymerization compound, wherein the photo-polymerization initiator further includes at least one among a thioxanthone-based initiator, an oxime-based initiator, and a benzophenone-based initiator.

A weight percent of the acetophenone-based initiator may be larger than a weight percent of the thioxanthone-based initiator, the oxime-based initiator, and the benzophenone-based initiator.

The acetophenone-based initiator may be 50 wt % or more for the total content of the photo-polymerization initiator.

The photosensitive resin composition may further include at least one among an antioxidant, a dispersant, and a scatterer.

The nanophosphor may be one of a quantum dot and an inorganic phosphor.

The quantum dot may include at least one selected from a Group II-VI compound, a Group III-V compound, a Group IV-VI compound, a Group IV element, and a Group IV compound, and the quantum dot is a core-shell structure including a core and a shell covering the core.

The core may include at least one compound selected from the group consisting of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, and the shell may include at least one compound selected from the group consisting of CdSe, ZnSe, ZnS, ZnTe, CdTe, PbS, TiO, SrSe, CdO, CdS, ZnO, InP, InS, GaP, GaN, GaO, InZnP, InGaP, InGaN, InZn-SCdSe, and HgSe.

The inorganic phosphor may include at least one selected from a garnet series, a silicate series, a sulfide series, an oxynitrides series, a nitride series, and an aluminate series.

A display device according to an exemplary embodiment of the present disclosure includes: a display panel; and a color conversion panel disposed on the display panel, wherein the color conversion panel includes a color conversion intermediate layer formed of a photosensitive resin composition, the photosensitive resin composition includes a nanophosphor, a photo-polymerization initiator including an acetophenone-based initiator, and a photo-polymerization compound, and the photo-polymerization initiator further includes at least one among a thioxanthone-based initiator, an oxime-based initiator, and a benzophenone-based initiator.

A weight percent of the acetophenone-based initiator may be larger than a weight percent of the thioxanthone-based initiator, the oxime-based initiator, and the benzophenone-based initiator.

The acetophenone-based initiator may be 50 wt % or more for the total content of the photo-polymerization initiator.

The display device may further include a light assembly supplying light to the display panel and the color conversion panel.

The display panel may be disposed between the light assembly and the color conversion panel.

The display panel may include a thin film transistor disposed on the first insulation substrate, a pixel electrode connected to the thin film transistor, a second insulation substrate facing the first insulation substrate to be separated therefrom, a common electrode disposed on one surface of the second insulation substrate toward the first insulation substrate, and a liquid crystal layer disposed between the pixel electrode and the common electrode.

The display panel may include an insulation substrate, a thin film transistor disposed on the insulation substrate, a pixel electrode connected to the thin film transistor, a roof layer disposed to face the pixel electrode, and a liquid crystal layer disposed in a plurality of microcavities between the pixel electrode and the roof layer.

The display panel may include liquid crystal panel, and a polarizer disposed on both surfaces of the liquid crystal panel.

A display device according to an exemplary embodiment of the present disclosure includes: a thin film transistor array panel; a color conversion display panel facing the thin film transistor array panel; and a liquid crystal layer disposed between the thin film transistor array panel and the color conversion display panel, wherein the color conversion display panel includes a color conversion intermediate layer formed of a photosensitive resin composition, the photosensitive resin composition includes a nanophosphor, a photo-polymerization initiator including an acetophenone-based initiator, and a photo-polymerization compound, and the photo-polymerization initiator includes at least one among a thioxanthone-based initiator, an oxime-based initiator, and a benzophenone-based initiator.

A weight percent of the acetophenone-based initiator may be larger than a weight percent of the thioxanthone-based initiator, the oxime-based initiator, and the benzophenone-based initiator.

The acetophenone-based initiator may be 50 wt % or more for the total content of the photo-polymerization initiator.

The photosensitive resin composition including the nanophosphor according to an exemplary embodiment of the present disclosure may reduce the quenching phenomenon generated by the damage of the nanophosphor depending on the process progress using the predetermined initiator. Also, the photosensitive resin composition according to an exemplary embodiment of the present disclosure has excellent exposure sensitivity, thereby providing a pattern with improved reliability.

DETAILED DESCRIPTION

Figure 1:
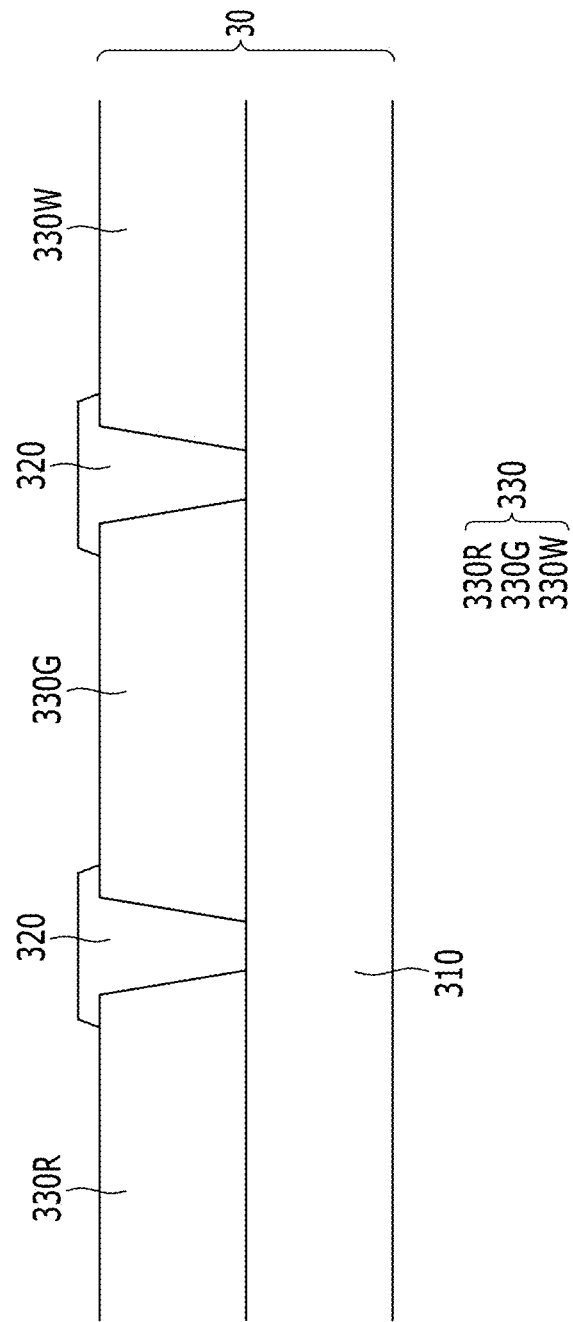
FIG. 1 is a cross-sectional view of a color conversion panel according to an exemplary embodiment.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. As used herein, the term "and/or" includes any and all combinations of one or more of the associated listed items.

Embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. In the drawings, the thickness of layers, films, panels, regions, etc., are exaggerated for explanation. In other words, since sizes and thicknesses of components in the drawings are arbitrarily illustrated for convenience of explanation, the following embodiments are not limited thereto. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present Now, a photosensitive resin composition according to an exemplary embodiment will be described.

A photosensitive resin composition according to an exemplary embodiment includes a nanophosphor, a photo-polymerization initiator, and a photo-polymerization compound.

Firstly, the nanophosphor according to an exemplary embodiment may include at least one of a quantum dot and an inorganic phosphor.

The quantum dot may include a Group II-VI compound, a Group III-V compound, a Group IV-VI compound, a Group IV element, a Group IV compound, or combinations thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a tertiary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a tertiary compound selected from the group consisting of GaNP, GaNAs, GaNSb, GaPAs, GaPSb, AlNP, AlNAs, AlNSb, AlPAs, AlPSb, InNP, InNAs, InNSb, InAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInNAs, GaInPSb, InAlNP, InAlNAs, InAlNSb, InAlPAs, InAlPSb, and a mixture thereof. The Group IV-VI compound may be selected from the group consisting of a binary compound selected from the group consisting of SnS, SnSe, SnTe, PbS, PbSe, PbTe, and a mixture thereof; a tertiary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the tertiary compound, or the quaternary compound may exist in particles at a uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced nearer to the center thereof.

For example, the quantum dot may have a core/shell structure including a core and a shell covering the core.

The core may include one or more materials selected from the group consisting of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, but is not limited thereto. The shell may include one or more materials selected from the group consisting of CdSe, ZnSe, ZnS, ZnTe, CdTe, PbS, TiO, SrSe, CdO, CdS, ZnO, InP, InS, GaP, GaN, GaO, InZnP, InGaP, InGaN, InZnSCdSe, and HgSe, but is not limited thereto.

An average particle diameter of the core of the core/shell quantum dot may be 2 nm to 5 nm. An average thickness of the shell may be 3 nm to 5 nm. Further, the average particle diameter of the quantum dot may be 5 nm to 10 nm. In the case where the core, the shell, and the quantum dot satisfy the aforementioned range of the average particle diameter or average thickness, a characteristic behavior of the quantum dot may be performed, and in a composition for forming a pattern, excellent dispersibility may be realized. In the aforementioned range, by appropriately selecting the particle diameter of the core, the average thickness of the shell, and the average particle diameter of the quantum dot, light emitting colors of the quantum dot and/or semiconductor characteristics of the quantum dot and the like may be modified.

Further, a form of the quantum dot is a form generally used in the art and is not particularly limited, but more specifically, it is preferable to use forms such as spherical, pyramidal, multi-arm-shaped, or cubic nanoparticles, nanotubes, nanowires, nanofibers, and nanoplate-shaped particles.

In some embodiments, the inorganic phosphor may include one or more of garnets, silicates, sulfides, oxides (oxynitrides), nitrides, and aluminates.

In some embodiments, the inorganic phosphor may include one or more materials selected from the group consisting of $Y_3Al_5O_{12}:Ce^{3+}$(YAG:Ce), $Tb_3Al_5O_{12}:Ce^{3+}$ (TAG:Ce), $(Sr,Ba,Ca)_2SiO_4:Eu^{2+}$, $(Sr,Ba,Ca,Mg,Zn)_2Si(OD)_4:Eu^{2+}$ D=F,Cl,S,N,Br, $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, SiAlON:$Ce^{3+}$, β-SiAlON:$Eu^{2+}$, Ca-α-SiAlON:$Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2\pm}$.

In some embodiments, the photo-polymerization initiator has a function of initiating a cross-linking and curing reaction between photosensitive functional groups among the photosensitive resin composition and between the photosensitive materials.

In some embodiments, the photo-polymerization initiator may include an acetophenone-based initiator, a benzophenone-based initiator, an oxime-based initiator, and a thioxanthone-based initiator. In some embodiments, the photo-polymerization initiator includes the acetophenone-based initiator, and may further include at least one among the thioxanthone-based initiator, the oxime-based initiator, and the benzophenone-based initiator.

The photosensitive resin composition including the acetophenone-based initiator may prevent a quenching phenomenon of the nanophosphor, and by further including the thioxanthone-based initiator, the oxime-based initiator, and the benzophenone-based initiator, the exposure sensitivity may be improved.

In some embodiments, the weight percent of the acetophenone-based initiator may be larger than weight percent of the thioxanthone-based initiator, the oxime-based initiator, and the benzophenone-based initiator, and particularly the acetophenone-based initiator may be 50 wt % or more compared with the total amount of the photo-polymerization initiator. In a range satisfying this weight percent condition, the thioxanthone-based initiator, the oxime-based, and the benzophenone-based initiator excluding the acetophenone-based initiator may have various weight percents.

In some embodiments, the acetophenone-based initiator may include 4'-phenoxydichloroacetophenone, 4'-t-butyldichloroacetophenone, 4'-t-butyltrichloroacetophenone, 2,2-diethoxyacetophenone, 2-hydroxy-2-methyl-1-phenylpropane-1-one, 1-(4-isopropylphenyl)-2-hydroxy-2-methylpropane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxycyclohexylphenylketone, 2-methyl-1-[4-(methylthio)phenyl]-2-morpholino-propane-1, and the like, but is not limited thereto.

In some embodiments, the benzophenone-based initiator may include benzophenone, 2-benzoylbenzoic acid, 2-benzoyl benzoic acid methyl ester, 4-phenyl benzophenone, hydroxybenzophenone, 4-benzoyl-4'-methyl diphenyl sulfide, or 3,3'-dimethyl-4-methoxy-benzophenone, however it is not limited thereto.

In some embodiments, the oxime-based initiator may include an O-acyloxime-based compound, 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, or O-ethoxycarbonyl-α-oxyamino-1-phenylpropane-1-one. In some embodiments, the O-acyloxime-based compound may include 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione 2-oxime-O-benzoate, 1-(4-phenylsulfanylphenyl)-octane-1,2-dione 2-oxime-O-benzoate, 1-(4-phenylsulfanylphenyl)-octane-1-one oxime-O-acetate, 1-(4-phenylsulfanylphenyl)-butane-1-one oxime-O-acetate, and the like.

In some embodiments, the thioxanthone-based photo-polymerization initiator may include thioxanthone, 2-chlorothioxanthone, 2-methylthioxanthone, isopropylthioxanthone, 2,4-diethylthioxanthone, 2,4-diisopropylthioxanthone, and the like.

As the photo-polymerization compound participates in the cross-linking and the curing reaction along with the photosensitive compound, the photosensitive functional group is bonded to the surface of the nanophosphor upon exposure, the resolution of the photosensitive resin pattern and the durability of the cured material are improved.

The photo-polymerization compound may have the ethylenic double bond to cause sufficient polymerization during exposure in a process of forming the pattern, and may thus form the pattern having excellent heat resistance, light resistance, and chemical resistance.

In some embodiments, examples of the photo-polymerization compound may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether(meth)acrylate, trimethylol propane tri(meth)acrylate, tris(meth)acryloyloxyethyl phosphate, novolac epoxy(meth)acrylate, and the like.

Further, the photo-polymerization compound may be a multi-functional acrylate-based compound or a multi-functional polyalkylene oxide or polysiloxane-based polymer including one or more of an acrylate group and a vinyl group.

In some embodiments, examples of the photo-polymerization compound may include urethane acrylate, allyloxylated cyclohexyl diacrylate, bis(acryloxyethyl)hydroxyl isocyanurate, bis(acryloxyneopentylglycol) adipate, bisphenol A diacrylate, bisphenol A dimethacrylate, 1,4-butanediol diacrylate, 1,4-butanediol dimethacrylate, 1,3-butylenegly-col diacrylate, 1,3-butylene glycol dimethacrylate, dicyclopentanyl diacrylate, diethylene glycol diacrylate, diethylene glycol dimethacrylate, dipentaerythritol hexaacrylate, dipentaerythritol monohydroxy hexaacrylate, ditrimethylolpropane tetraacrylate, ethylene glycol dimethacrylate, glycol methacrylate, 1,6-hexanediol diacrylate, neopentyl glycol dimethacrylate, neopentyl glycol hydroxypivalate diacrylate, pentaerythritol triacrylate, pentaerythritol tetraacrylate, phosphoric acid dimethacrylate, polyethylene glycol diacrylate, polypropylene glycol diacrylate, tetraethylene glycol diacrylate, tetrabromobisphenol A diacrylate, triethylene glycol divinylether, triglycerol diacrylate, trimethylolpropane triacrylate, tripropylene glycol diacrylate, tris(acryloxyethyl) isocyanurate, phosphoric acid triacrylate, phosphoric acid diacrylate, acrylic acid propargyl ester, polydimethylsiloxane having a vinyl group at a terminal thereof (vinyl-terminated polydimethylsiloxane), a diphenylsiloxane-dimethylsiloxane copolymer having a vinyl group at a terminal thereof (vinyl-terminated diphenylsiloxane-dimethylsiloxane copolymer), polyphenylmethylsiloxane having a vinyl group at a terminal thereof (vinyl-terminated polyphenylmethylsiloxane), a trifluoromethylsiloxane-dimethylsiloxane copolymer having a vinyl group at a terminal thereof (vinyl-terminated trifluoromethylsiloxane-dimethylsiloxane copolymer), a diethylsiloxane-dimethylsiloxane copolymer having a vinyl group at a terminal thereof (vinyl-terminated diethylsiloxane-dimethylsiloxane copolymer), vinylmethylsiloxane, polydimethyl siloxane having a monomethacryloxypropyl group at a terminal thereof (monomethacryloyloxypropyl-terminated polydimethyl siloxane), polydimethyl siloxane having a monovinyl group at a terminal thereof (monovinyl-terminated polydimethyl siloxane), or polyethylene oxide having a monoallyl group or a monotrimethylsiloxy group at a terminal thereof (monoallyl-monotrimethylsiloxy-terminated polyethylene oxide.

The content of the photo-polymerization compound is not particularly limited, and may be appropriately selected based on the desired photocuring properties (a curing speed, a cured film state, and the like), the bond number of photosensitive functional groups of the surface of the nanophosphor, and the like.

In some embodiments, the photo-polymerization compound may further include one or more materials selected from a cyanine-based material, a merocyanine-based material, an oxonol-based material, a phthalocyanine-based material, an azo-based material, a fluorene-based material, a thiophene-based material, a diphenylethene-based material, and a phenoxazine-based material in order to form a precise pattern, but is not limited thereto.

As the photo-polymerization compound, monofunctional or multi-functional esters of (meth)acrylic acid having at least one ethylenic double bond may be used singularly, or a combination of two or more may be used together. The photo-polymerization compound may be treated by acid anhydride to be used so that an excellent developing property is realized.

In some embodiments, the photosensitive resin composition further includes a solvent, and the solvent may be ethylene glycol acetate, ethyl cellosolve, propylene glycol methylether acetate, ethyl lactate, polyethylene glycol, cyclohexanone, or propylene glycol methylether.

In some embodiments, the organic solvent used to form the quantum dot-containing pattern may be at least one selected from the group consisting of dimethyl formamide (DMF), 4-hydroxy-4-methyl-2-pentanone, ethylene glycol monoethyl ether, 2-methoxyethanol, chloroform, chlorobenzene, toluene, tetrahydrofuran, dichloromethane, hexane, heptane, octane, nonane, and decane, however it is not limited thereto.

The nanophosphor including the quantum dot or the inorganic phosphor may be added in the photosensitive resin composition as the nanophosphor itself or may be added as a shape of a nanophosphor dispersion solvent including the dispersant, etc.

In some embodiments, the dispersant that may be included in the photosensitive resin composition may be a non-ionic dispersant, an ionic dispersant, or a cationic dispersant and may be selectively used, and for example, polyalkylene glycol and an ester thereof; polyoxyalkylene; a polyalcohol ester alkylene oxide addition; an alcohol alkylene oxide addition; and the like may be used alone or while being appropriately combined.

In some embodiments, the photosensitive resin composition may further include the antioxidant. As the antioxidant, phenol-based, phosphorus-based, and sulfur-based compounds may be used alone or two kinds or more thereof may be used.

In some embodiments, the phenol-based antioxidant may include 2,6-di-tert-butyl-p-cresol, 2,6-diphenyl-4-octadesiloxyphenol, stearyl(3,5-di-tert-butyl-4-hydroxyphenyl) propionate, distearyl(3,5-di-tert-butyl-4-hydroxybenzyl)phosphonate, tridecyl-3,5-di-tert-butyl-4-hydroxybenzyl thioacetate, thiodiethylenebis[(3,5-di-tert-butyl-4-hydroxyphenyl)propionate], 4,4'-thiobis(6-tert-butyl-m-cresol), 2-octylthio-4,6-di(3,5-di-tert-butyl-4-hydroxyphenoxy)-s-triazine, 2,2'-methylenebis(4-methyl-6-tert-butylphenol), bis[3,3-bis(4-hydroxy-3-tert-butylphenyl)butyric acid]glycolester, 4,4'-butylidenebis(2,6-di-tert-butylphenol), 4,4'- butylidenebis(6-tert-butyl-3-methylphenol), 2,2'-ethylidenebis(4,6-di-tert-butylphenol), 1,1,3-tris(2-methyl-4-hydroxy-5-tert-butylphenyl)butane, bis[2-tert-butyl-4-methyl-6-(2-hydroxy-3-tert-butyl-5-methylbenzyl)phenyl] terephthalate, 1,3,5-tris(2,6-dimethyl-3-hydroxy-4-tert-butylbenzyl) isocyanurate, 1,3,5-tris(3,5-di-tert-butyl-4-hydroxybenzyl) isocyanurate, 1,3,5-tris(3,5-di-tert-butyl-4-hydroxybenzyl)-2,4,6-trimethylbenzene, 1,3,5-tris[(3,5-di-tert-butyl-4-hydroxyphenyl)propionyloxyethyl] isocyanurate, tetrakis[methylene-3-(3',5'-di-tert-butyl-4'-hydroxyphenyl) propionate]methane, 2-tert-butyl-4-methyl-6-(2-acryloyloxy-3-tert-butyl-5-methylbenzyl)phenol, 3,9-bis[2-(3-tert-butyl-4-hydroxy-5-methylhydrocinnamoyloxy)-1,1-dimethylethyl]-2,4,8,10-tetraoxaspiro[5,5]undecane, triethyleneglycolbis[β-(3-tert-butyl-4-hydroxy-5-methylphenyl) propionate], tocophenol, and the like.

In some embodiments, the phosphorus-based antioxidant may include triphenyl phosphite, tris(2,4-di-tert-butylphenyl)phosphite, tris(2,5-di-tert-butylphenyl)phosphite, tris (nonylphenyl)phosphite, tris(dinonylphenyl)phosphite, tris (mono,di-mixed nonylphenyl)phosphite, diphenylacid phosphite, 2,2'-methylenebis(4,6-di-tert-butylphenyl)octyl phosphite, diphenyldecyl phosphite, diphenyloctyl phosphite, di(nonylphenyl)pentaerythritol diphosphite, phenyldiisodecyl phosphite, tributyl phosphite, tris(2-ethylhexyl) phosphite, tridecyl phosphite, trilauryl phosphite, dibutyl acid phosphite, dilauryl acid phosphite, trilauryl trithiophosphite, bis(neopentyl glycol) 1,4-cyclohexanedimethyl diphosphite, bis(2,4-di-tert-butylphenyl)pentaerythritol diphosphite, bis(2,5-di-tert-butylphenyl)pentaerythritol diphosphite, bis(2,6-di-tert-butyl-4-methylphenyl)pentaerythritol diphosphite, bis(2,4-dicumylphenyl)pentaerythritol diphosphite, distearylpentaerythritol diphosphite, tetra (C12-15 mixed-alkyl)-4,4'-isopropylidenediphenyl phosphite, bis[2,2'-methylenebis(4,6-diamylphenyl)].isopropylidenediphenyl phosphite, tetratridecyl.4,4'-butylidenebis(2-tert-butyl-5-methylphenol)diphosphite, hexa(tridecyl).1,1,3-tris(2-methyl-5-tert-butyl-4-hydroxyphenyl)butane.triphosphite, tetrakis(2,4-di-tert-butylphenyl) biphenylene diphosphonite, tris(2-[(2,4,7,9-tetrakis-tert-butyldibenzo[d,f][1,3,2]dioxaphosphepin-6-yl)oxy]ethyl) amine, 9,10-dihydro-9-oxa-10-phosphaphenanthrene-10-oxide, tris(2-[(2,4,8,10-tetrakis-tert-butyldibenzo[d,f][1,3,2] dioxaphosphepin-6-yl)oxy]ethyl)amine, 2-(1,1-dimethylethyl)-6-methyl-4-[3-[[2,4,8,10-tetrakis(1,1-dimethylethyl)dibenzo[d,f][1,3,2]dioxaphosphepin-6-yl] oxy]propyl]phenol2-butyl-2-ethylpropanediol.2,4,6-tri-tert-butylphenol monophosphite, and the like.

In some embodiments, the sulfur-based antioxidant may include dialkylthiodipropionates such as dilauryl, dimyristyl, myristylstearyl, and distearylester of thiodipropionic acid, pentaerythritoltetra(β-dodecyl mercapto propionate), and β-alkylmercaptopropionic acid esters of polyol.

In some embodiments, the photosensitive resin composition may further include the scatterer. The scatterer scatters the incident light to increase the amount of light emitted and passing the photosensitive resin composition and to make the front luminance and the lateral luminance to be uniform.

In some embodiments, the scatterer may include at least among $TiO_2$, $Al_2O_3$, and $SiO_2$, and it is not limited thereto.

The content and the size of the scatterer are not specially limited, and may be appropriately selected by considering the configuration of the photosensitive resin composition. In some embodiments, the diameter (nm) of the scatterer may be 1/10 to 5/10 of the light wavelength (nm) emitted from the photosensitive resin composition, and as a result the scattering efficiency of the emitted light is improved.

In some embodiments, the photosensitive resin composition may further include an alkali-soluble resin, and the alkali-soluble resin may improve the sensitivity, a remainder rate, and the like of the photosensitive resin layer.

As described above, the photosensitive resin composition including at least one of the thioxanthone-based initiator, the oxime-based initiator, and the benzophenone-based initiator while including the acetophenone-based initiator provides the improved exposure sensitivity while preventing the quenching phenomenon of the nanophosphor according to the manufacturing process, thereby possessing properties such as the improved light efficiency and the smooth patterning.

In some embodiments, the photosensitive resin composition may be used as the color filter composition, and a color conversion intermediate layer using the described photosensitive resin composition and will be described with reference to FIG. 1. FIG. 1 is a cross-sectional view of a color conversion panel according to an exemplary embodiment of the present invention.

As shown in FIG. 1, the color conversion panel 30 includes a plurality of color conversion intermediate layers 330 disposed on the insulation substrate 310 and a light blocking member 320 disposed between the plurality of adjacent color conversion intermediate layers 330. The plurality of color conversion intermediate layers 330 according to the present exemplary embodiment may include a red color conversion intermediate layer 330R, a green color conversion intermediate layer 330G, and a polymer layer 330W.

The light blocking member 320 defines the region where the red color conversion intermediate layer 330R, the green color conversion intermediate layer 330G, and the polymer layer 330W are disposed, and the light blocking member 320 is disposed between the red color conversion intermediate layer 330R, the green color conversion intermediate layer 330G, and the polymer layer 330W.

The red color conversion intermediate layer 330R converts supplied blue light into red, and for this, the red color conversion intermediate layer 330R may include the red phosphor, and the red phosphor may include at least one material among CaS, SrS, BaS, $Ca_2Si_5N_8$, $Sr_2Si_5N_8$, $Ba_2Si_5N_8$, $CaAlSiN_3$, $CaMoO_4$, and $Eu_2Si_5N_8$.

The green color conversion intermediate layer 330G converts the supplied blue light into green, the green color conversion intermediate layer 330G may include the green phosphor, and the green phosphor may be at least one material among yttrium aluminum garnet (YAG), $Ca_2SiO_4$, $Sr_2SiO_4$, $Ba_2SiO_4$, $SrGa_2S_4$, BAM, α-SiAlON, β-SiAlON, $Ca_3Sc_2Si_3O_{12}$, $Tb_3Al_5O_{12}$, $BaSiO_4$, CaAlSiON, and $(Sr_{1-x}Ba_x)Si_2O_2N_2$. In this case, x may be a number between 0 and 1.

Also, the red color conversion intermediate layer 330R and the green color conversion intermediate layer 330G may include quantum dots converting the color instead of the phosphor. The quantum dots may be the same as the above-described constituent element.

The polymer layer 330W is made of a transparent polymer, and the blue light supplied from a light assembly 500 is transmitted to appear blue. In the region emitting the blue, the polymer layer 330W may emit the incident light as it is without a separate phosphor or quantum dot.

In this case, the materials of the red color conversion intermediate layer, the green color conversion intermediate layer, and the polymer layer may be the above-described photosensitive resin composition, thereby being formed through the photolithography process. The photosensitive resin composition is the same as the above-described photosensitive resin composition such that the description thereof is omitted.

The above-described exemplary embodiment increases the light emitting efficiency and provides the color conversion intermediate layer having the excellent pattern characteristic, thereby providing the color conversion panel with the improved color reproducibility.

Figure 2:
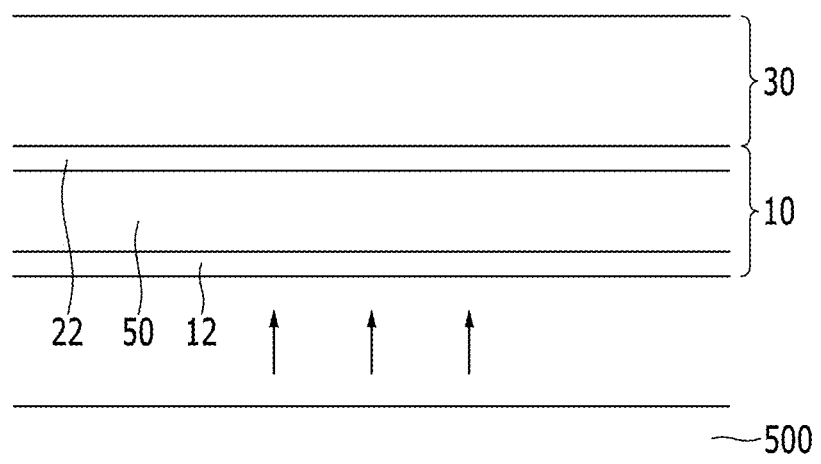
FIG. 2 is a schematic cross-sectional view of a display device according to an exemplary embodiment.
Figure 3:
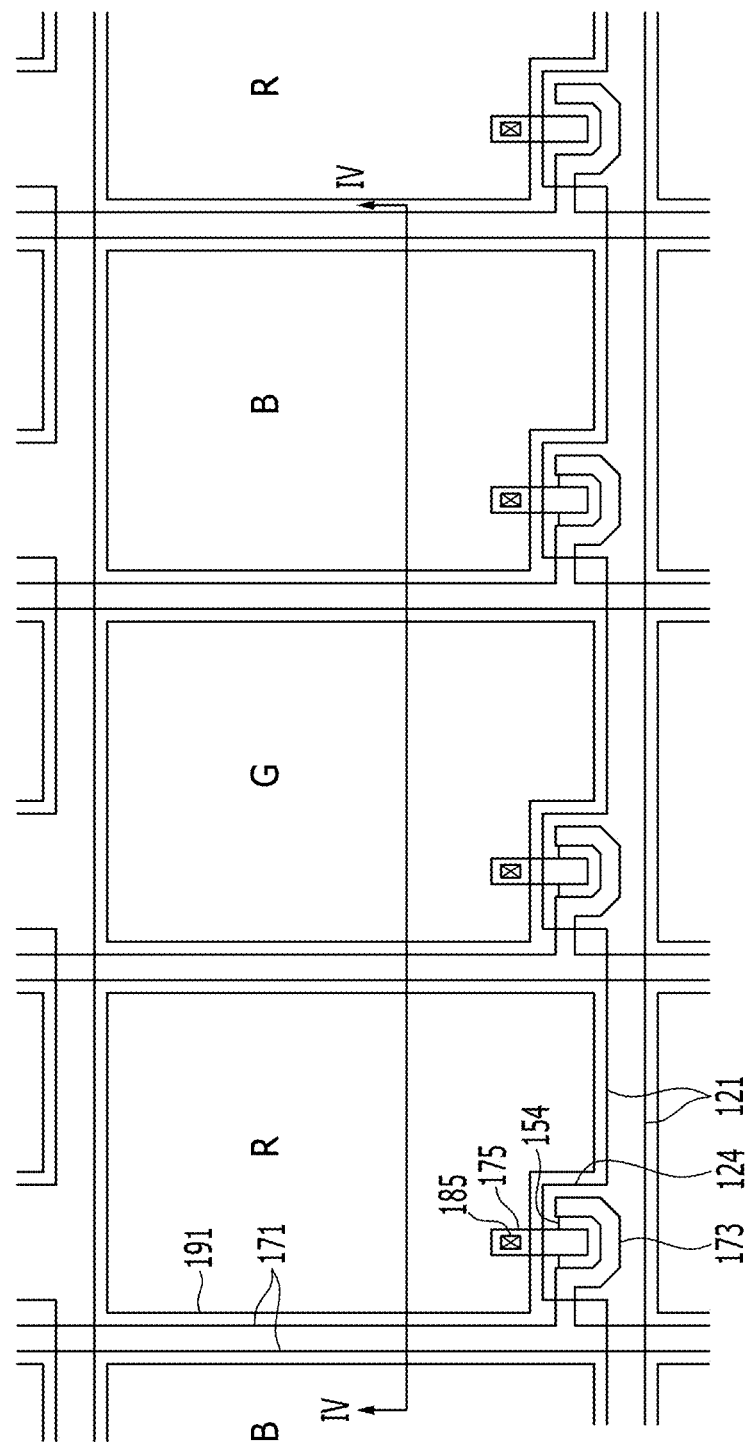
FIG. 3 is a top plan view of a display device according to an exemplary embodiment.
Figure 4:
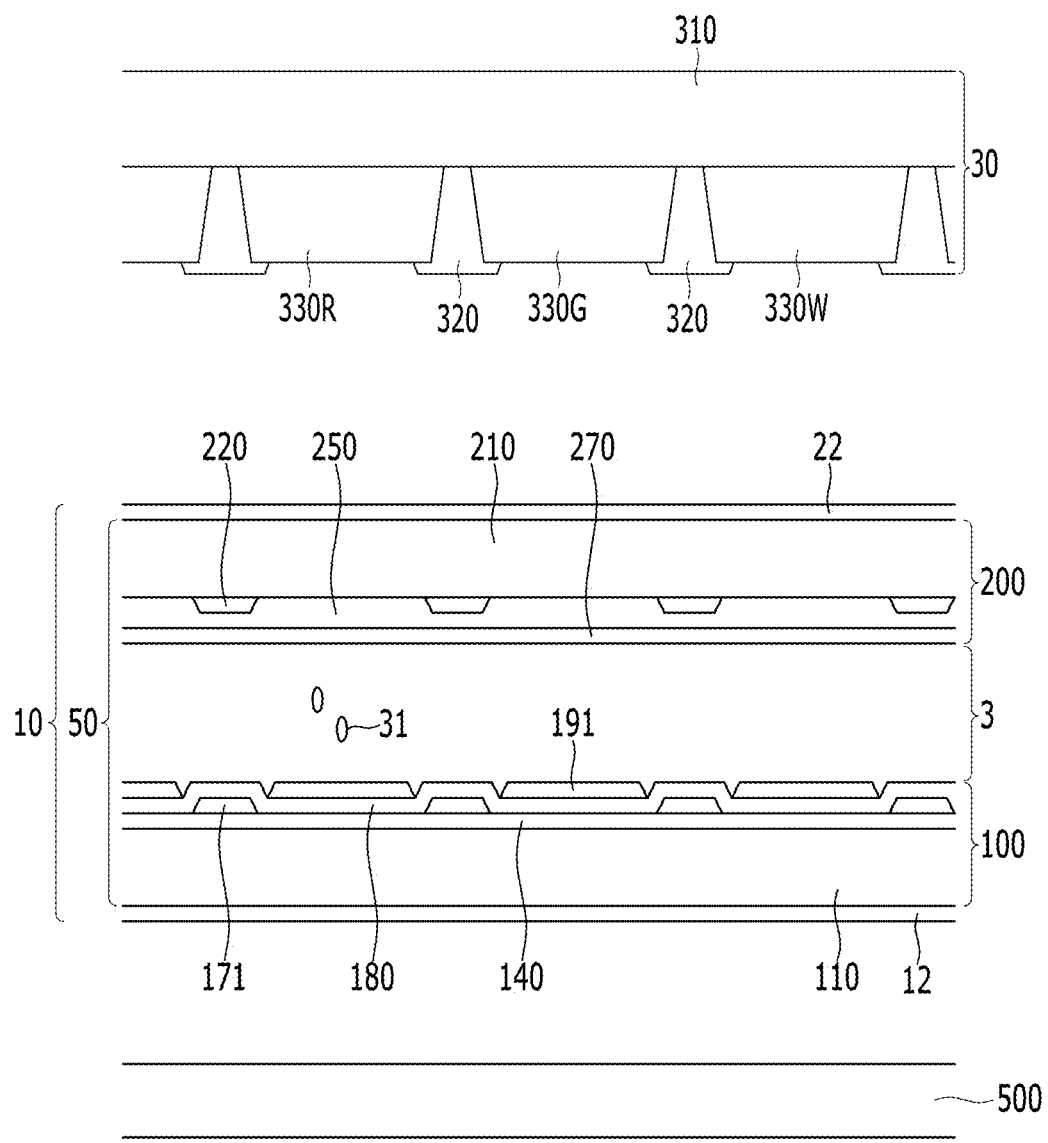
FIG. 4 is a cross-sectional view taken along a line IV-IV of FIG. 3.

Next, the display device will be described with reference to FIG. 2 to FIG. 4. FIG. 2 is a schematic cross-sectional view of a display device according to an exemplary embodiment, FIG. 3 is a top plan view of a display device according to an exemplary embodiment, and FIG. 4 is a cross-sectional view taken along a line IV-IV of FIG. 3. The description for the same constituent elements as the above-described constituent elements may be omitted.

Firstly, if the display device according to an exemplary embodiment will be described with reference to FIG. 2, the display device includes the color conversion panel 30, the display panel 10, and the light assembly 500.

The display panel 10 may include a liquid crystal panel 50 displaying an image and polarizers 12 and 22 disposed on both surfaces of the liquid crystal panel 50. A first polarizer 12 and a second polarizer 22 for polarization of the light incident from the light assembly 500 are disposed at both surfaces of the liquid crystal panel 50. The liquid crystal panel 50 will be described with reference to FIG. 3 to FIG. 6.

The light assembly 500 includes a light source disposed under the first polarizer 12 and generating light, and a light guide (not shown) receiving the light and guiding the received light in the direction of the display panel 10 and the color conversion panel 30.

In some embodiments, the light assembly 500 may include at least one light emitting diode (LED), and may be a blue light emitting diode (LED). The light source according to the present disclosure may be an edge-type light assembly disposed on at least one side of the light guide plate, or may be a direct type where the light source of the light assembly 500 is disposed in a direct lower portion of the light guide plate (not illustrated). However, the light source is not limited thereto.

In some embodiments, the color conversion panel 30 may be disposed on the display panel 10, and therefore, may be disposed above the second polarizer 22 or may contact it.

Referring to FIG. 3 and FIG. 4, the display device according to an exemplary embodiment includes the light assembly 500, the display panel 10 disposed on the light assembly 500, and the color conversion panel 30 disposed on the display panel 10. The color conversion panel 30 and the light assembly 500 according to an exemplary embodiment are the same as the color conversion panel of FIG. 1 and the light assembly of the FIG. 2 such that the description thereof is omitted.

The display panel 10 includes a lower panel 100 including a thin film transistor to display the image, an upper panel 200 including a second insulation substrate 210 facing the lower panel 100, and the liquid crystal panel 50 including a liquid crystal layer 3 interposed between the lower panel 100 and the upper panel 200.

The polarizers 12 and 22 are disposed at respective surfaces of the liquid crystal panel 50, and the polarizer 12 may be at least one of a coating-type polarizer and a wire grid polarizer. The polarizer 12 may be disposed at one surface of the upper panel 200 by various methods such as a film method, a coating method, an adhering method, and the like. However, this description is one example and it is not limited thereto.

A plurality of pixel electrodes are disposed in a matrix shape on a first insulation substrate 110 included in the lower panel 100.

A gate line 121 extending in a row direction and including a gate electrode 124, a gate insulating layer 140 disposed on the gate line 121, a semiconductor layer 154 disposed on the gate insulating layer 140, a data line 171 disposed on the semiconductor layer 154, extending in a column direction, and including a source electrode 173, a drain electrode 175, a passivation layer 180 disposed on the data line 171 and the drain electrode 175, and a pixel electrode 191 electrically and physically connected to the drain electrode 175 through a contact hole 185 are disposed on the first insulation substrate 110.

The semiconductor layer 154 disposed on the gate electrode 124 forms a channel layer in the region that is exposed by the source electrode 173 and the drain electrode 175, and the gate electrode 124, the semiconductor layer 154, the source electrode 173, and the drain electrode 175 form one thin film transistor.

Next, the second insulation substrate 210 faces the first insulation substrate 110 to be separated therefrom. Between the second insulation substrate 210 and the liquid crystal layer 3, a light blocking member 220, a planarization layer 250, and a common electrode 270 are disposed. The light blocking member 220 is disposed on one surface of the second insulation substrate 210 toward the first insulation substrate 110. The planarization layer 250 is disposed on the light blocking member 220 toward the first insulation substrate 110, and the planarization layer 250 may provide the flat surface. The common electrode 270 is disposed on the planarization layer 250 toward the first insulation substrate 110. According to an exemplary embodiment, the planarization layer 250 may be omitted.

The common electrode 270 applied with a common voltage forms an electric field with the pixel electrode 191 to arrange liquid crystal molecules 31 disposed in the liquid crystal layer 3 between the common electrode 270 and the pixel electrode 191.

The liquid crystal layer 3 includes a plurality of liquid crystal molecules 31, and an arrangement direction of the liquid crystal molecules 31 is controlled by an electric field between the pixel electrode 191 and the common electrode 270. According to the arrangement of the liquid crystal molecules, transmittance of light received from the light assembly 500 may be controlled to display an image.

The present specification describes a liquid crystal display panel where a liquid crystal panel forms a vertical electric field, but is not limited thereto, and the liquid crystal panel may be a liquid crystal panel forming a horizontal electric field or a display device such as a plasma display panel (PDP), an organic light emitting diode display (OLED), a surface conduction electron-emitter display (SED), a field emission display (FED), a vacuum fluorescent display (VFD), and an E-paper.

In some embodiments, the liquid crystal display has an improved emitting ratio and improved color reproducibility, thereby providing the display device with excellent display quality.

Figure 5:
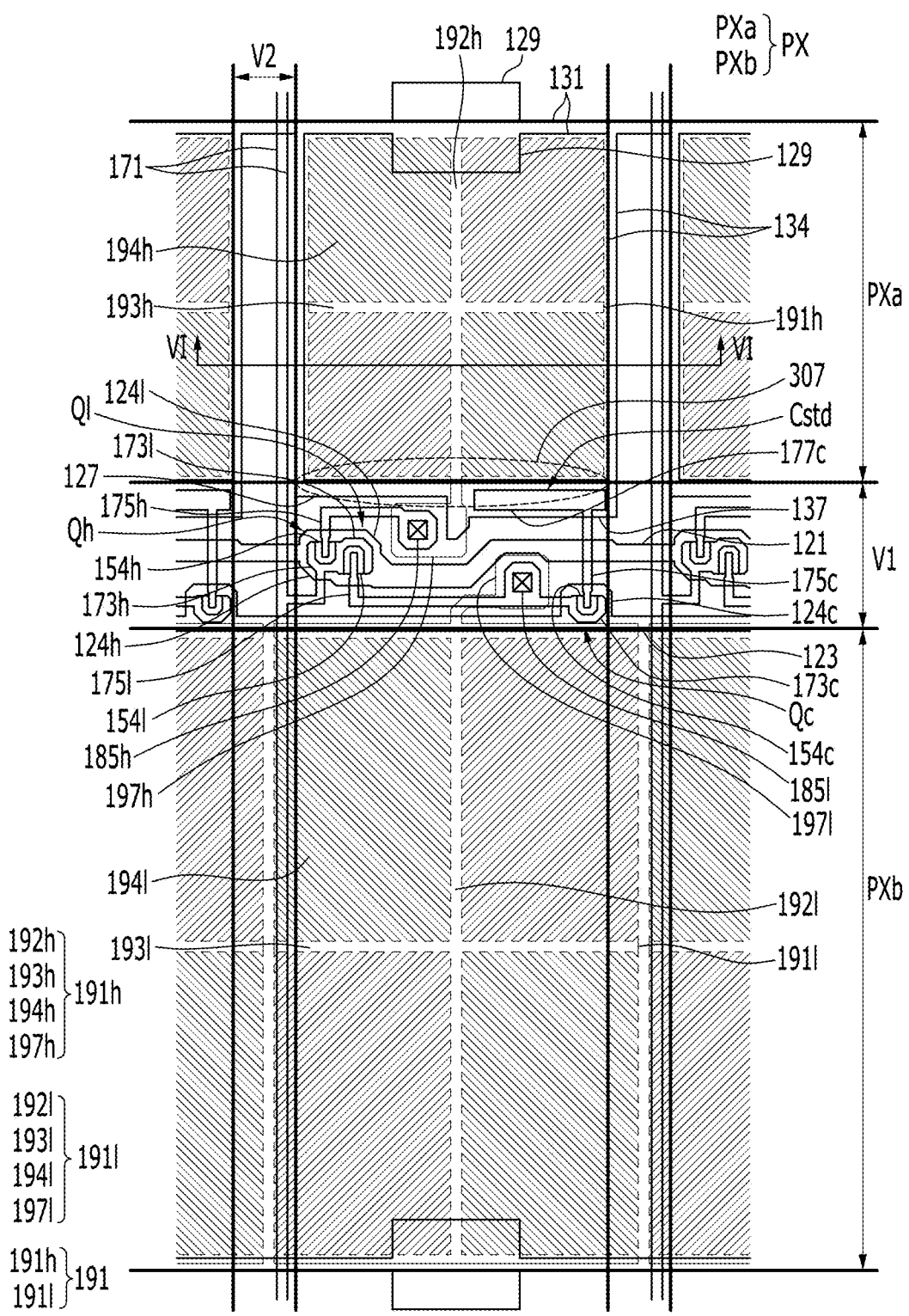
FIG. 5 is a top plan view of a display device according to an exemplary embodiment.

Next, the display device according to an exemplary embodiment of the present invention will be described with reference to FIG. 5 and FIG. 6. FIG. 5 is a top plan view of a display device according to an exemplary embodiment, and FIG. 6 is a cross-sectional view taken along a line VI-VI of FIG. 5.

Figure 6:
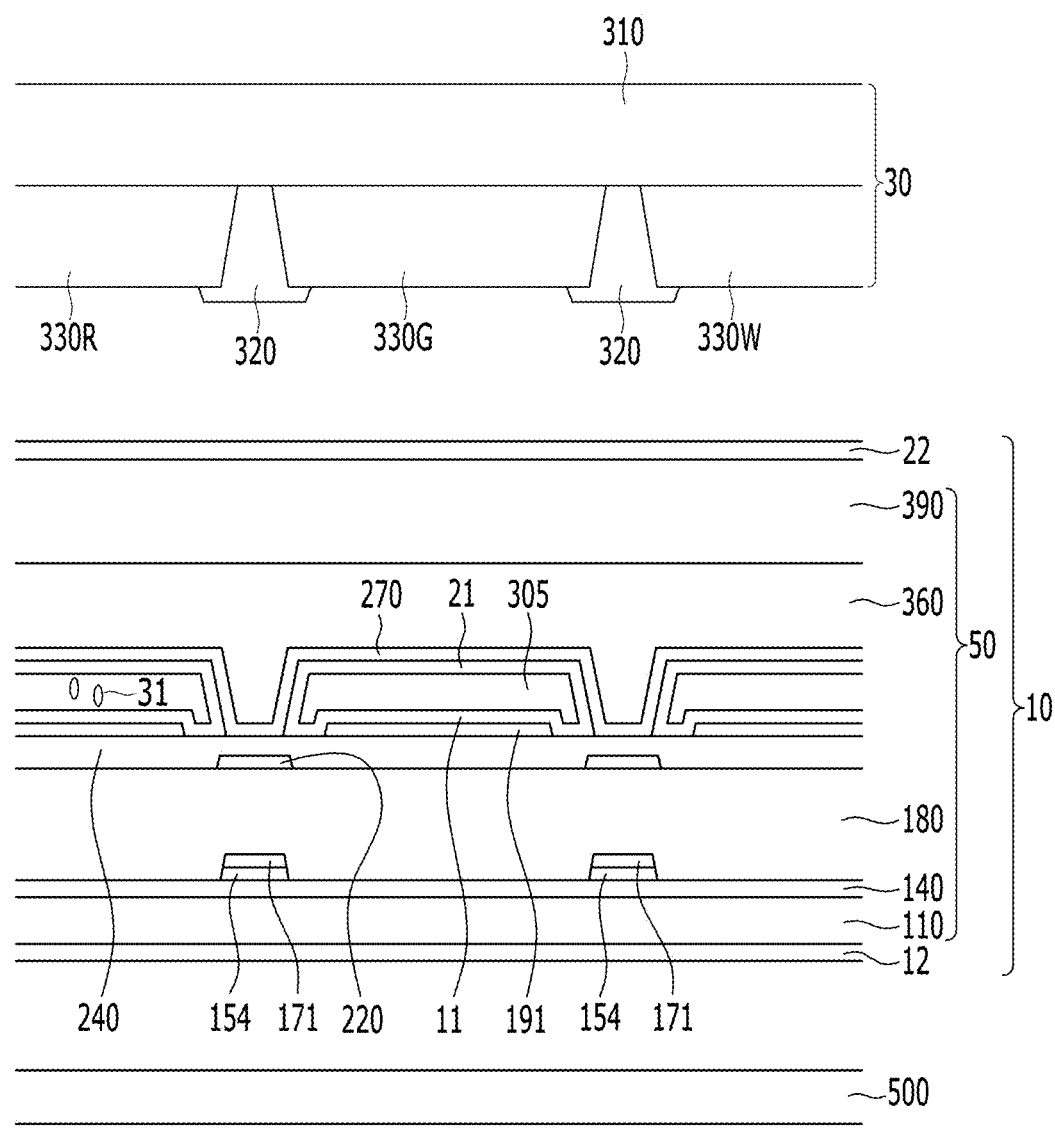
FIG. 6 is a cross-sectional view taken along a line VI-VI of FIG. 5.

Referring to FIG. 5 and FIG. 6, the display device according to an exemplary embodiment includes the display panel 10, the color conversion panel 30, and the light assembly 500. The display panel 10 may be disposed on the light assembly 500, and the color conversion panel 30 may be disposed on the display panel 10.

The display panel 10 may include the liquid crystal panel 50 and the polarizers 12 and 22 disposed on both surfaces of the liquid crystal panel 50. In this case, the polarizer 12 may be at least one of the coating-type polarizer and the wire grid polarizer, and the polarizers 12 and 22 may be variously disposed on both surfaces of the liquid crystal panel 50 such as the film type, the coating type, and the adhering type. However, this description is one example and it is not limited thereto.

On the other hand, the color conversion panel 30 and the light assembly 500 included in the display device according to an exemplary embodiment is the same as the above-described exemplary embodiment such that the detailed description is omitted.

The liquid crystal panel 50 includes a plurality of gate conductors including a plurality of gate lines 121, a plurality of step-down gate lines 123, and a plurality of storage electrode lines 131 disposed on the insulation substrate 110.

The gate lines 121 and the step-down gate lines 123 transfer gate signals and mainly extend in a transverse direction. The gate conductor further includes a first gate electrode 124h and a second gate electrode 124l protruding upward and downward from the gate line 121, and further includes a third gate electrode 124c protruding upward from the step-down gate line 123. The first gate electrode 124h and the second gate electrode 124l are connected with each other to form one protrusion. The protrusion form of the first, second, and third gate electrodes 124h, 124l, and 124c may be modified (FIG. 5).

The storage electrode line 131 mainly extends in a horizontal direction and transfers a predetermined voltage such as a common voltage Vcom. The storage electrode line 131 includes storage electrodes 129 protruding upward and downward, a pair of vertical portions 134 extending downward to be substantially perpendicular to the gate line 121, and a horizontal portion 127 connecting ends of the pair of vertical portions 134. The horizontal portion 127 includes a capacitor electrode 137 expanded downward (FIG. 5).

A gate insulating layer 140 is formed on the gate conductors 121, 123, 124h, 124l, 124c, and 131. The gate insulating layer 140 may be made of an inorganic insulating material such as a silicon nitride (SiNx) and a silicon oxide (SiOx). Further, the gate insulating layer 140 may be formed as a single layer or a multiple layer (FIG. 5).

A first semiconductor 154h, a second semiconductor 154l, and a third semiconductor 154c are formed on the gate insulating layer 140. The first semiconductor 154h may be disposed on the first gate electrode 124h, the second semiconductor 154l may be disposed on the second gate electrode 124l, and the third semiconductor 154c may be disposed on the third gate electrode 124c. The first semiconductor 154h and the second semiconductor 154l may be connected to each other, and the second semiconductor 154l and the third semiconductor 154c may also be connected to each other. In this case, the first semiconductor 154h may be extended to the lower portion of the data line 171. The first to third semiconductors 154h, 154l, and 154c may be made of amorphous silicon, polycrystalline silicon, a metal oxide, and the like.

An ohmic contact (not illustrated) may be further formed on each of the first to third semiconductors 154h, 154l, and 154c. The ohmic contact may be made of a silicide or a material such as n+ hydrogenated amorphous silicon in which an n-type impurity is doped at a high concentration.

A data conductor including a data line 171, a first source electrode 173h, a second source electrode 173l, a third source electrode 173c, a first drain electrode 175h, a second drain electrode 175l, and a third drain electrode 175c is formed on the first to third semiconductors 154h, 154l, and 154c.

The data line 171 transfers a data signal and mainly extends in a vertical direction to cross the gate line 121 and the step-down gate line 123. Each data line 171 extends toward the first gate electrode 124h and the second gate electrode 124l, and includes the first source electrode 173h and the second source electrode 173l which are connected with each other.

Each of the first drain electrode 175h, the second drain electrode 175I, and the third drain electrode 175c includes one wide end portion and the other rod-shaped end portion. The rod-shaped end portions of the first drain electrode 175h and the second drain electrode 175l are partially surrounded by the first source electrode 173h and the second source electrode 173l, respectively. One wide end portion of the second drain electrode 175l is again extended to form the third source electrode 173c which is bent in a 'U' shape. A wide end portion 177c of the third drain electrode 175c overlaps with the capacitor electrode 137 to form a step-down capacitor Cstd, and the rod-shaped end portion is partially surrounded by the third source electrode 173c.

The first gate electrode 124h, the first source electrode 173h, and the first drain electrode 175h form a first thin film transistor Qh together with the first semiconductor 154h, the second gate electrode 124I, the second source electrode 173I, and the second drain electrode 175I form a second thin film transistor Ql together with the second semiconductor 154I, and the third gate electrode 124c, the third source electrode 173c, and the third drain electrode 175c form the third thin film transistor Qc together with the third semiconductor 154c.

The first semiconductor 154h, the second semiconductor 154I, and the third semiconductor 154c are connected to each other to be formed in a linear shape, and may have substantially the same planar shape as the data conductors 171, 173h, 173I, 173c, 175h, 175I, and 175c and the ohmic contacts therebelow, except for channel regions between the source electrodes 173h, 173I, and 173c and the drain electrodes 175h, 175I, and 175c.

In the first semiconductor 154h, an exposed portion which is not covered by the first source electrode 173h and the first drain electrode 175h is disposed between the first source electrode 173h and the first drain electrode 175h. In the second semiconductor 154I, an exposed portion which is not covered by the second source electrode 173I and the second drain electrode 175I is disposed between the second source electrode 173I and the second drain electrode 175I. In addition, in the third semiconductor 154c, an exposed portion which is not covered by the third source electrode 173c and the third drain electrode 175c is disposed between the third source electrode 173c and the third drain electrode 175c.

A passivation layer 180 is formed on the data conductors 171, 173h, 173I, 173c, 175h, 175I, and 175c and the semiconductors 154*h*, 154*l*, and 154*c* exposed between the respective source electrodes 173*h*/173*l*/173*c* and the respective drain electrodes 175*h*/175*l*/175*c*. The passivation layer 180 may be made of an organic insulating material or an inorganic insulating material, and may be formed as a single layer or a multiple layer.

A light blocking member 220 is disposed on the passivation layer 180. The light blocking member 220 is formed on a boundary of the pixel area PX and the thin film transistor to prevent light leakage.

A first insulating layer 240 may be disposed on the light blocking member 220. The first insulating layer 240 may be made of an inorganic insulating material such as a silicon nitride ($SiN_x$), a silicon oxide ($SiO_x$), and a silicon oxynitride ($SiO_xN_y$). The first insulating layer 240 serves to protect the light blocking member 220 made of the organic material, and may be omitted if necessary.

The first insulating layer 240, the light blocking member 220, and the passivation layer 180 have a plurality of first contact holes 185*h* and a plurality of second contact hole 185*l* respectively exposing the wide end of the first drain electrode 175*h* and the wide end of the second drain electrode 175*l*.

A pixel electrode 191 is formed on the first insulating layer 240. The pixel electrode 191 may be made of a transparent metal material such as indium tin oxide (ITO) and indium zinc oxide (IZO).

The pixel electrode 191 includes a first subpixel electrode 191*h* and a second subpixel electrode 191*l* which are separated from each other with the gate line 121 and the step-down gate line 123 therebetween, and are disposed above and below the pixel area PX based on the gate line 121 and the step-down gate line 123 to be adjacent to each other in a column direction. That is, the first subpixel electrode 191*h* and the second subpixel electrode 191*l* are separated from each other with a first valley V1 therebetween, the first subpixel electrode 191*h* is disposed in a first subpixel area PXa, and the second subpixel electrode 191*l* is disposed in a second subpixel area PXb.

The first subpixel electrode 191*h* and the second subpixel electrode 191*l* are connected with the first drain electrode 175*h* and the second drain electrode 175*l* through the first contact hole 185*h* and the second contact hole 185*l*, respectively. Accordingly, when the first thin film transistor Qh and the second thin film transistor Ql are turned on, the first thin film transistor Qh and the second thin film transistor Ql receive data voltages from the first drain electrode 175*h* and the second drain electrode 175*l*.

An overall shape of each of the first subpixel electrode 191*h* and the second subpixel electrode 191*l* is a quadrangle, and the first subpixel electrode 191*h* and the second subpixel electrode 191*l* include cross stems including horizontal stems 193*h* and 193*l* and vertical stems 192*h* and 192*l* crossing the horizontal stems 193*h* and 193*l*, respectively. Further, the first subpixel electrode 191*h* and the second subpixel electrode 191*l* include a plurality of minute branches 194*h* and 194*l*, and protrusions 197*h* and 197*l* protruding downward or upward from edge sides of the subpixel electrodes 191*h* and 191*l*, respectively.

The pixel electrode 191 is divided into four subregions by the horizontal stems 193*h* and 193*l* and the vertical stems 192*h* and 192*l*. The minute branches 194*h* and 194*l* obliquely extend from the horizontal stems 193*h* and 193*l* and the vertical stems 192*h* and 192*l*, and the extending direction may form an angle of approximately 45 degrees or 135 degrees with the gate line 121 or the horizontal stems 193*h* and 193*l*. Further, directions in which the minute branches 194*h* and 194*l* of two adjacent subregions extend may be perpendicular to each other.

The arrangement of the pixel area, the structure of the thin film transistor, and the shape of the pixel electrode that are described above are just exemplarily described, and the present disclosure is not limited thereto, but may be variously modified.

The common electrode 270 is formed on the pixel electrode 191 so as to be spaced apart from the pixel electrode 191 by a predetermined distance. A microcavity 305 is formed between the pixel electrode 191 and the common electrode 270. That is, the microcavity 305 is surrounded by the pixel electrode 191 and the common electrode 270. A width and an area of the microcavity 305 may be variously modified according to a size and a resolution of the display device (FIG. 6).

The common electrode 270 may be made of a transparent metal material such as indium tin oxide (ITO) and indium zinc oxide (IZO). A predetermined voltage may be applied to the common electrode 270, and an electric field may be generated between the pixel electrode 191 and the common electrode 270.

A first alignment layer 11 is formed on the pixel electrode 191. A second alignment layer 21 is disposed below the common electrode 270 so as to face the first alignment layer 11.

The first alignment layer 11 and the second alignment layer 21 may be formed as vertical alignment layers, and may be made of alignment materials such as polyamic acid, polysiloxane, and polyimide. The first and second alignment layers 11 and 21 may be connected to each other at the edge of the pixel PX.

A liquid crystal layer which is formed of liquid crystal molecules 31 is formed in the microcavity 305 which is disposed between the pixel electrode 191 and the common electrode 270. The liquid crystal molecules 31 have negative dielectric anisotropy, and when no electric field is applied, may be aligned in a direction perpendicular to the substrate 110. That is, vertical orientation may be generated.

The first subpixel electrode 191*h* and the second subpixel electrode 191*l* to which the data voltage is applied generate an electric field together with the common electrode 270 so as to determine an orientation of the liquid crystal molecules 31 disposed in the microcavity 305 between the two electrodes 191 and 270. Luminance of light which passes through the liquid crystal layer may vary depending on the orientation of the liquid crystal molecules 31 determined as described above.

A roof layer 360 is disposed on the common electrode 270. The roof layer 360 may be formed of the organic material. The microcavity 305 is formed below the roof layer 360, and the roof layer 360 is hardened by a curing process to maintain the shape of the microcavity 305. The roof layer 360 is formed to be spaced apart from the pixel electrode 191 with the microcavity 305 therebetween.

The roof layer 360 is formed in each pixel area PX and the partition portion V2 along the pixel row, and is not formed in a liquid crystal injection hole formation region V1. That is, the roof layer 360 is not formed between the first subpixel area PXa and the second subpixel area PXb. In each first subpixel area PXa and each second subpixel area PXb, the microcavity 305 is formed below each roof layer 360. In the partition portion V2, the microcavity 305 is not formed below the roof layer 360, the roof layer 360 is protruded downward to form the partition portion V2, and the partition portion V2 may define the microcavities adjacent to each other in the row direction. Accordingly, the thickness of the roof layer 360 disposed at the partition portion V2 may be formed to be thicker than the thickness of the roof layer 360 disposed at the first subpixel area PXa and the second subpixel area PXb. An upper surface and both sides of the microcavity 305 are formed to be covered by the roof layer 360.

An inlet part 307 exposing a part of the microcavity 305 is formed in the common electrode 270 and the roof layer 360. Inlet parts 307 may be formed to face each other at edges of the first subpixel area PXa and the second subpixel area PXb. That is, each inlet part 307 may be formed such that it corresponds to a lower side of the first subpixel area PXa and an upper side of the second subpixel area PXb so as to expose lateral sides of the microcavity 305. Since the microcavity 305 is exposed by the inlet part 307, an aligning agent or a liquid crystal material may be injected into the microcavity 305 through the injection hole 307.

An overcoat 390 may be formed on the roof layer 360.

The overcoat 390 is disposed to cover the inlet part 307 exposing the part of the microcavity 305 to the outside. That is, the overcoat 390 may seal the microcavity 305 such that the liquid crystal molecules 31 formed in the microcavity 305 are not discharged to the outside. Since the overcoat 390 contacts the liquid crystal molecules 31, the overcoat 390 may be made of a material that is not reactive with the liquid crystal molecules 31.

The overcoat 390 may consist of a multilayer such as a double layer and a triple layer. The double layer consists of two layers that are made of different materials. The triple layer consists of three layers, and materials of adjacent layers are different from each other. For example, the overcoat 390 may include a layer that is made of an organic insulating material and a layer that is made of an inorganic insulating material.

In the display device according to an exemplary embodiment, the light emission ratio is improved and the color reproducibility is improved, thereby providing the display device of the excellent display quality, and one sheet substrate is also used, thereby simplifying the manufacturing process and the structure.

Figure 7:
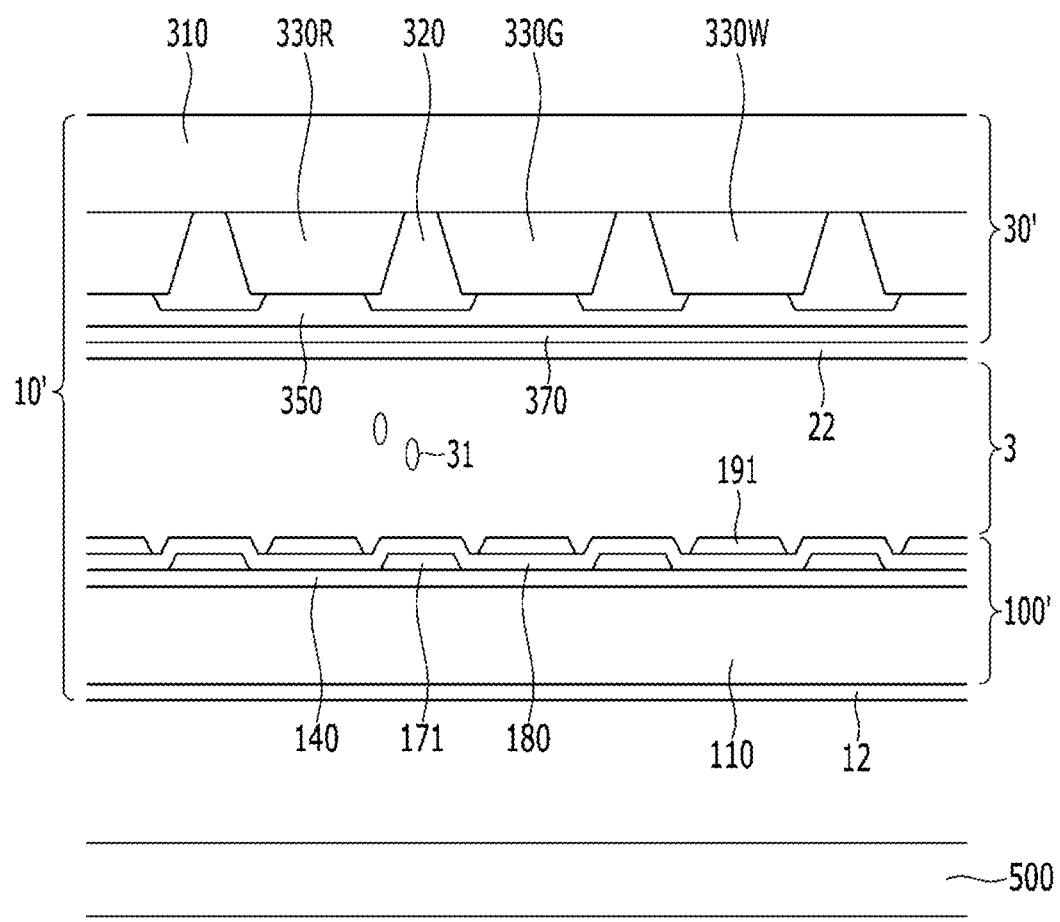
FIG. 7 is a cross-sectional view of a display device according to an exemplary embodiment.

Next, the display device according to an exemplary embodiment will be described with reference to FIG. 7. FIG. 7 is a cross-sectional view of a display device according to an exemplary embodiment. The description of the same as or similar constituent elements to the above-described exemplary embodiment is omitted.

The display device according to an exemplary embodiment shown in FIG. 7 includes a display panel 10' and a light assembly 500. The display panel 10' may be disposed on the light assembly 500, though it is not limited thereto, and the up/down position may be changed depending on the exemplary embodiment.

The display panel 10' according to an exemplary embodiment includes a thin film transistor array panel 100', the color conversion panel 30' facing and separated from the thin film transistor array panel 100', and the liquid crystal layer 3 disposed between the thin film transistor array panel 100' and a color conversion panel 30' and including the liquid crystal molecules. That is, in the display panel 10' according to an exemplary embodiment, unlike in the above-described exemplary embodiment, the color conversion panel 30' forms part of the display panel 10'.

The display panel 10' may further include the first polarizer 12 disposed at one surface of the thin film transistor array panel 100' and the second polarizer 22 disposed at one surface of the color conversion panel 30'.

The thin film transistor array panel 100' according to the present exemplary embodiment is the same as the lower panel 100 of FIG. 3 and FIG. 4 and the color conversion panel 30' is similar to the color conversion panel 30 of FIG. 1 such that it will be described with reference to FIG. 1, FIG. 3, and FIG. 4, as well as FIG. 7.

First, the plurality of pixel electrodes are disposed in a matrix shape on the first insulation substrate 110 included in the thin film transistor array panel 100'.

The gate line 121 extending in the row direction and including the gate electrode 124, the gate insulating layer 140 disposed on the gate line 121, the semiconductor layer 154 disposed on the gate insulating layer 140, the data line 171 disposed on the semiconductor layer 154, extending in a column direction, and including the source electrode 173, the drain electrode 175, the passivation layer 180 disposed on the data line 171 and the drain electrode 175, and the pixel electrode 191 electrically and physically connected to the drain electrode 175 through the contact hole 185 are disposed on the first insulation substrate 110.

The semiconductor layer 154 disposed on the gate electrode 124 forms the channel layer in the region that is exposed by the source electrode 173 and the drain electrode 175, and the gate electrode 124, the semiconductor layer 154, the source electrode 173, and the drain electrode 175 form one thin film transistor.

Next, an insulation substrate 310 faces the first insulation substrate 110 to be separated therefrom. Between the insulation substrate 310 and the liquid crystal layer 3, a plurality of color conversion intermediate layers 330R, 330G, and 330W and a light blocking member 320 between the plurality of color conversion intermediate layers 330R, 330G, and 330W are disposed. In detail, the plurality of color conversion intermediate layers 330R, 330G, and 330W and the light blocking member 320 are located on one side of the first insulation substrate 110 that faces the insulation substrate 310.

The light blocking member 320 defines the region where the red color conversion intermediate layer 330R, the green color conversion intermediate layer 330G, and the polymer layer 330W are disposed, and the red color conversion intermediate layer 330R, the green color conversion intermediate layer 330G, and the polymer layer 330W are disposed between the light blocking members 320.

The red color conversion intermediate layer 330R may convert the blue light supplied from the light assembly 500 into red, and the green color conversion intermediate layer 330G may convert the blue light supplied from the light assembly 500 into green. For this, the red color conversion intermediate layer 330R and the green color conversion intermediate layer 330G may include any one of the phosphor and the quantum dot.

The polymer layer 330W is made of the transparent polymer, and the blue light supplied from the light assembly 500 is transmitted to appear blue. The polymer layer 330W corresponding to the region emitting blue may include the material (as one example, the polymer such as the photosensitive resin) emitting the incident blue without the separate phosphor or quantum dot.

Next, a planarization layer 350 is disposed on one surface of the plurality of color conversion intermediate layer 330R, 330G, and 330W and the light blocking member 320 toward the first insulation substrate 110. The planarization layer 350 may provide the flat surface, and a common electrode 370 disposed on one surface of the planarization layer 350 toward the first insulation substrate 110. The planarization layer 350 may be omitted according to an exemplary embodiment.

The common electrode 370 applied with the common voltage forms the electric field with the pixel electrode 191 and arranges the liquid crystal molecules 31 disposed in the liquid crystal layer 3.

The liquid crystal layer 3 includes a plurality of liquid crystal molecules 31, and the arrangement direction of the liquid crystal molecules 31 is controlled by the electric field between the pixel electrode 191 and the common electrode 370. According to the arrangement of the liquid crystal molecules, transmittance of light transmitted from the light assembly 500 may be controlled to display an image.

The display device according to the above-described exemplary embodiment does include the upper panel 200 shown in FIG. 4, and the color conversion panel 30' replaces the function and the position of the upper panel. This display device may be provided with the further thinner thickness and the cost and weight may be reduced.

The exemplary embodiment in which the photosensitive film resin composition according to an exemplary embodiment is used in the color filter of the display device has been given, however the photosensitive film resin composition according to an exemplary embodiment may be applied to any display device.

Figure 8A:
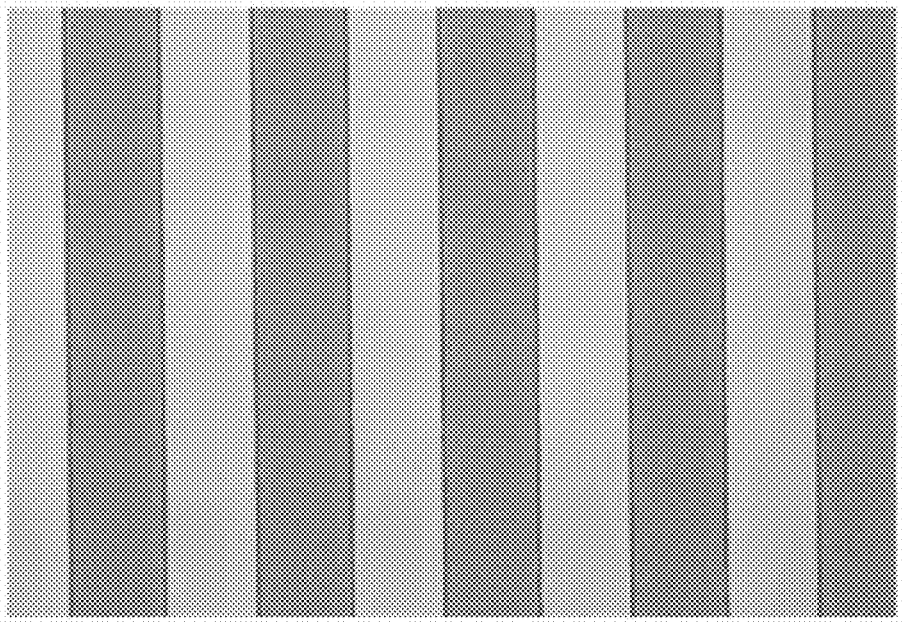
FIG. 8A, FIG. 8B, and FIG. 8C are images of a photosensitive resin composition according to an exemplary embodiment.
Figure 8B:
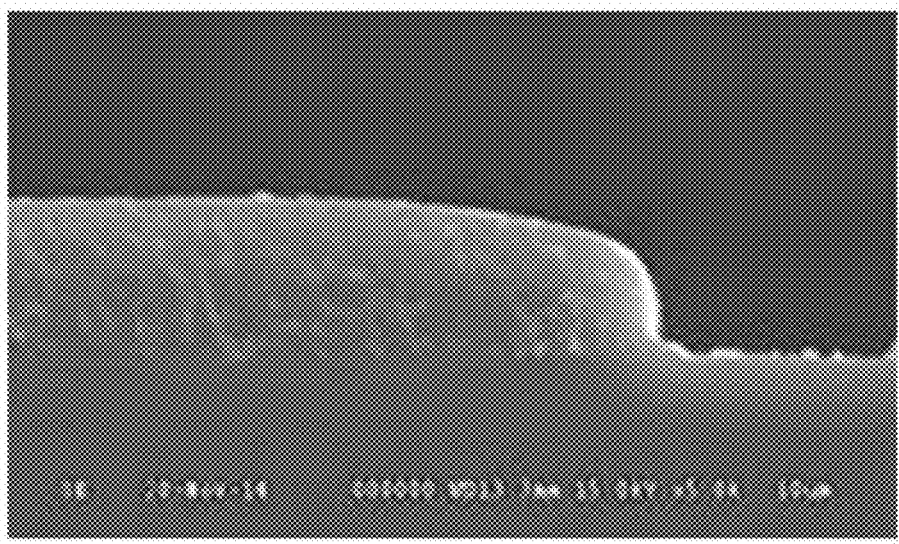
Figure 8C:
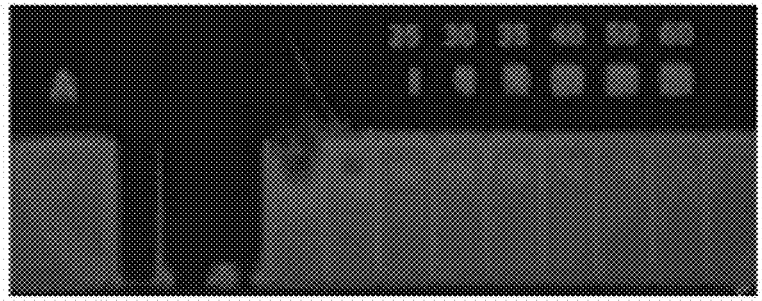
Figure 10:
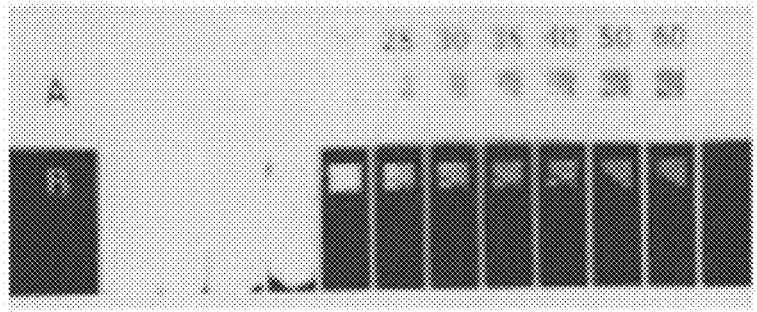
Figure 11:
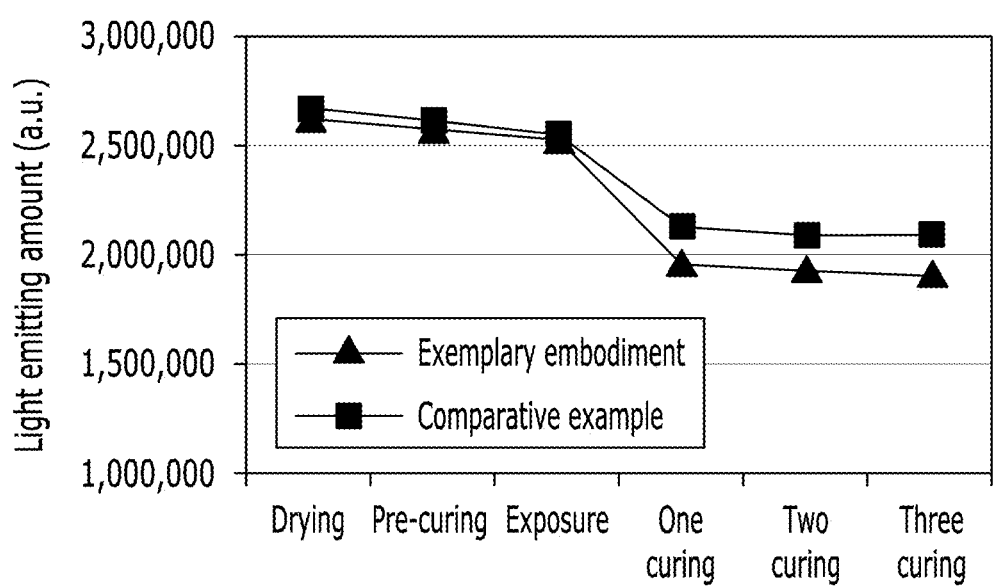
FIG. 11 and FIG. 12 are graphs of a light emitting amount and a light storage ratio of a photosensitive resin composition according to an exemplary embodiment and a comparative example.
Figure 12:
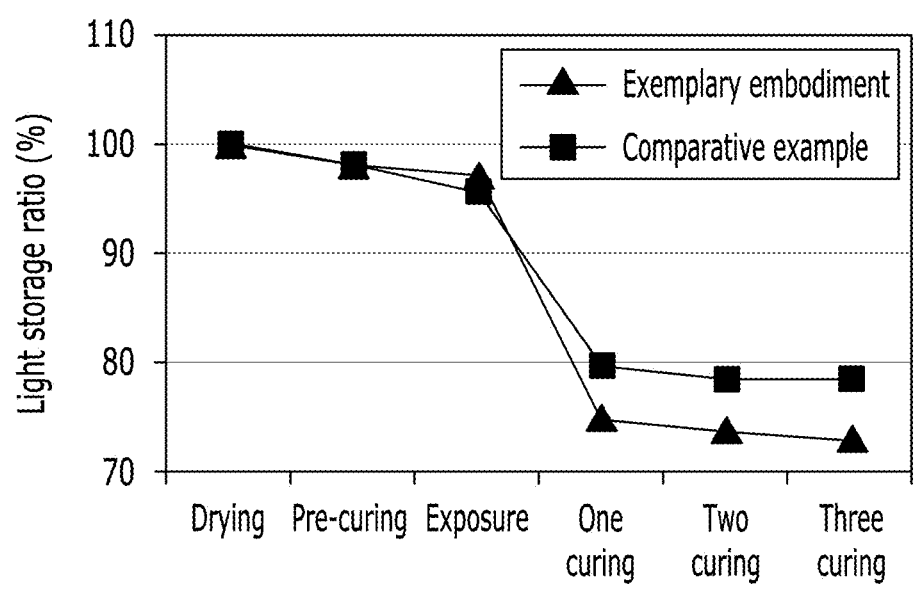

Next, an exemplary embodiment and a comparative example will be described with reference to FIG. 8A to FIG. 12. FIG. 8A, FIG. 8B, and FIG. 8C are images of a photosensitive resin composition according to an exemplary embodiment, and FIG. 9A, FIG. 9B, FIG. 9C, and FIG. 10 are images of a photosensitive resin composition according to a comparative example. FIG. 11 and FIG. 12 are graphs of a light emitting amount and a light storage ratio of a photosensitive resin composition according to an exemplary embodiment and a comparative example.

Firstly, FIG. 8A and FIG. 8B relate to the photosensitive resin composition according to an exemplary embodiment, relate to a photosensitive resin composition including a acetophenone-based initiator, a thioxanthone-based initiator, and an oxime-based initiator as a photo-polymerization initiator having a weight ratio of 7:2:1.

As a result of performing the exposure and developing process by using the photosensitive resin composition, as shown in FIG. 8A and FIG. 8B, it may be confirmed that the patterned photosensitive resin composition does not have an under-cut and a clear pattern is formed.

Also, as a result of examining the exposure sensitivity of the photosensitive resin composition, as shown in FIG. 8C, exposure sensitivity of about 30 mJ is shown.

Figure 9A:
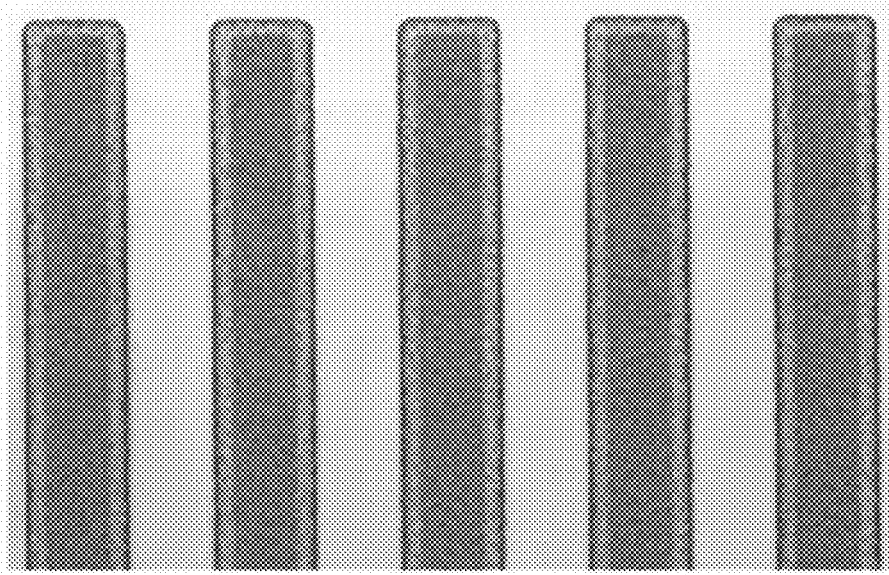
FIG. 9A, FIG. 9B, FIG. 9C, and FIG. 10 are images of a photosensitive resin composition according to a comparative example.
Figure 9B:
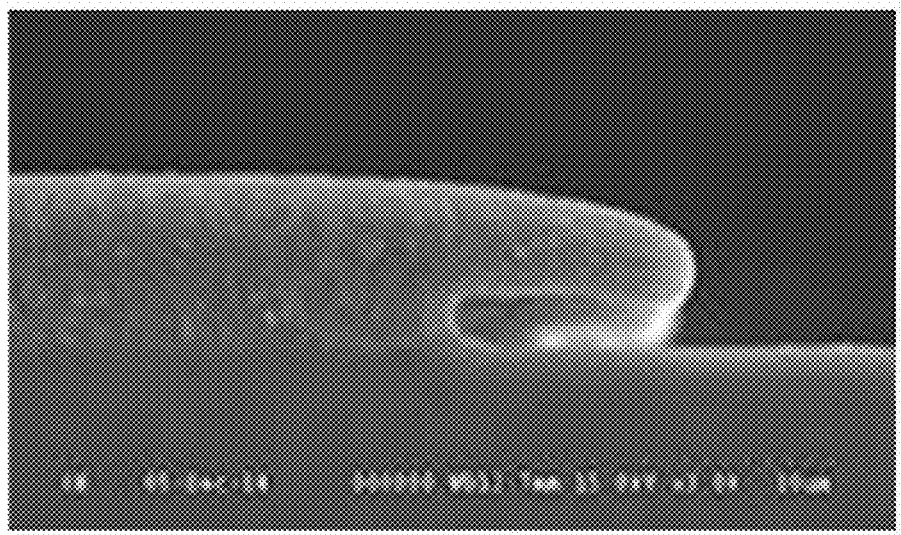

In contrast, when the photosensitive resin composition including only the acetophenone-based initiator as the comparative example is described, as shown in FIG. 9A to FIG. 9B, it may be confirmed that the undercut occurs to a significant degree in the progression of exposure and developing processes for the photosensitive resin according to the comparative example. The possibility of a disconnection or a short is high such that the reliability of the display device may be deteriorated.

Figure 9C:
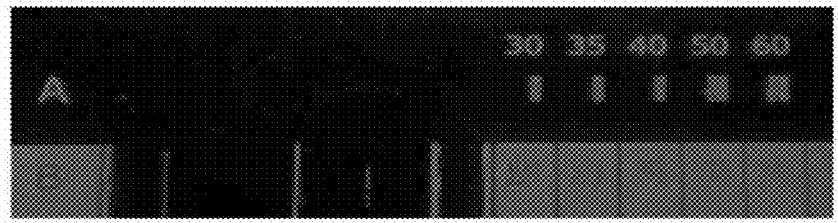

Also, as shown in FIG. 9C, the photosensitive resin composition according to the comparative example has exposure sensitivity of about 50 mJ, thus the exposure sensitivity is decreased by about 30-40% compared with the exemplary embodiment.

When the exposure sensitivity for the general is described with reference FIG. 10, the general color filter according to the comparative example can be seen to have exposure sensitivity of about 35 mJ. When comparing FIG. 8C with FIG. 9C and FIG. 10, the photosensitive resin composition according to an exemplary embodiment not only improves the optical efficiency through the nanophosphor, but also obtains the excellent exposure sensitivity.

When using only the acetophenone-based initiator, the quenching phenomenon of the nanophosphor is prevented such that the light storage ratio is increased, however the exposure characteristic is deteriorated such that the patterning may be irregular or the undercut may be generated. That is, the light storage ratio and the exposure characteristic have an inverse relationship with each other. More specifically, the quenching phenomenon of the nanophosphor (particularly, the quantum dot) is generated by a radical or oxidation induced gas caused in the patterning process (particularly, the curing process) of the photosensitive resin composition. Particularly, in the case of the photosensitive resin composition having the exposure characteristic, the quenching phenomenon is further accelerated.

However, according to an exemplary embodiment, the excellent exposure characteristic may be provided through the additives such as the thioxanthone-based initiator, the oxime-based initiator, and the benzophenone-based initiator as well as the acetophenone-based initiator.

Next, the light emitting amount and the light storage ratio according to the patterning process of the photosensitive resin composition according to an exemplary embodiment and the comparative example will be described with reference to FIG. 11 and FIG. 12.

As shown in FIG. 8A to FIG. 10, the photosensitive resin composition according to an exemplary embodiment has exposure sensitivity of the level of the conventional color filter. In this case, whether the photosensitive resin composition according to an exemplary embodiment has the light emitting amount of the conventional level is a problem.

For the photosensitive resin composition according to an exemplary embodiment and the comparative example, 1) drying is performed for two hours in ambient conditions, 2) a pre-curing process is performed for three minutes in a 100° C. temperature condition, and 3) after exposure is performed by irradiating UV light of 100 mJ, 4) a curing process performing for 30 minutes in a 180° C. temperature condition is repeated three times.

First, referring to FIG. 11, the comparative example as the photosensitive resin composition only including the acetophenone-based initiator shows a light emitting amount that is slightly higher than about 2,000,000 a.u. after the curing process performed three times.

On the other hand, according to an exemplary embodiment of the present invention, the photosensitive resin composition including the acetophenone-based initiator, the thioxanthone-based initiator, and the oxime-based initiator shows a light emitting amount that is slightly lower than about 2,000,000 a.u. after the curing process (a post bake) performed three times.

Next, referring to FIG. 12, the comparative example only using the acetophenone-based initiator having the excellent thermal durability shows a light storage ratio of about 80%, and the photosensitive resin composition according to an exemplary embodiment shows a light storage ratio that is slightly lower than about 80%. That is, almost the same light storage ratio (a difference within about 5%) appears in the comparative example and the exemplary embodiment.

In summary, the photosensitive resin composition (the comparative example) only using the acetophenone initiator prevents the quenching phenomenon depending on the curing process such that the light emitting amount of more than a predetermined level may appear, however, although the photosensitive resin composition according to an exemplary embodiment includes the other initiators as well as the acetophenone initiator, it may be confirmed that almost the same light emitting amount (the difference within about 5%) as the photosensitive resin composition only including the acetophenone-based initiator may appear as the acetophenone-based initiator of more than the predetermined weight is included.

As described above, by adding the predetermined photopolymerization initiator to the photosensitive resin composition including the nanophosphor according to an exemplary embodiment, the excellent exposure sensitivity may be provided while preventing the quenching phenomenon due to the damage of the nanophosphor generated in the process, thereby improving the light efficiency and the reliability of the display device.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope of the present disclosure as defined by the following claims

What is claimed is:

1. A photosensitive resin composition comprising:
a nanophosphor;
a photo-polymerization initiator including an acetophenone-based initiator; and
at least one among a thioxanthone-based initiator, an oxime-based initiator, and a benzophenone-based initiator;
a photo-polymerization compound,
wherein the nanophosphor is a quantum dot and wherein the quantum dot includes at least one selected from a Group II-VI compound, a Group III-V compound, a Group IV-VI compound, a Group IV element, and a Group IV compound, and the quantum dot is a core-shell structure including a core and a shell covering the core
wherein a weight percent of the acetophenone-based initiator is larger than a weight percent of at least one among the thioxanthone-based initiator, the oxime-based initiator, and the benzophenone-based initiator.

2. The photosensitive resin composition of claim 1, wherein the acetophenone-based initiator is 50 wt % or more for the total content of the photo-polymerization initiator.

3. The photosensitive resin composition of claim 1, wherein the photosensitive resin composition further includes at least one among an antioxidant, a dispersant, and a scatterer.

4. The photosensitive resin composition of claim 1, wherein
the core includes a compound of at least one selected from the group consisting of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, and
the shell includes a compound of at least one selected from the group consisting of CdSe, ZnSe, ZnS, ZnTe, CdTe, PbS, TiO, SrSe, CdO, CdS, ZnO, InP, InS, GaP, GaN, GaO, InZnP, InGaP, InGaN, InZnSCdSe, and HgSe.

5. The photosensitive resin composition of claim 1, wherein the inorganic phosphor includes at least one selected from a garnet series, a silicate series, a sulfide series, an oxynitrides series, a nitride series, and an aluminate series.

6. A display device comprising:
a display panel; and
a color conversion panel disposed on the display panel,
wherein the color conversion panel includes a color conversion intermediate layer formed of a photosensitive resin composition,
the photosensitive resin composition includes a nanophosphor, a photo-polymerization initiator including an acetophenone-based initiator, and at least one among a thioxanthone-based initiator, an oxime-based initiator, and a benzophenone-based initiator;
wherein a weight percent of the acetophenone-based initiator is larger than a weight percent of at least one among the thioxanthone-based initiator, the oxime-based initiator, and the benzophenone-based initiator, and
a photo-polymerization compound.

7. The display device of claim 6, wherein the acetophenone-based initiator is 50 wt % or more for the total content of the photo-polymerization initiator.

8. The display device of claim 6, further comprising a light assembly supplying light to the display panel and the color conversion panel.

9. The display device of claim 8, wherein the display panel is disposed between the light assembly and the color conversion panel.

10. The display device of claim 6, wherein the display panel includes:
a thin film transistor disposed on a first insulation substrate;
a pixel electrode connected to the thin film transistor;
a second insulation substrate facing the first insulation substrate to be separated therefrom;
a common electrode disposed on one surface of the second insulation substrate toward the first insulation substrate; and
a liquid crystal layer disposed between the pixel electrode and the common electrode.

11. The display device of claim 6, wherein the display panel includes:
an insulation substrate;
a thin film transistor disposed on the insulation substrate;
a pixel electrode connected to the thin film transistor;
a roof layer disposed to face the pixel electrode; and
a liquid crystal layer disposed in a plurality of microcavities between the pixel electrode and the roof layer.

12. The display device of claim 6, wherein the display panel includes:
a liquid crystal panel; and
a polarizer disposed on both surfaces of the liquid crystal panel.

13. A display device comprising:
a thin film transistor array panel;
a color conversion display panel facing the thin film transistor array panel; and
a liquid crystal layer disposed between the thin film transistor array panel and the color conversion display panel, wherein the color conversion display panel includes a color conversion intermediate layer formed of a photosensitive resin composition, the photosensitive resin composition includes a nanophosphor, a photo-polymerization initiator including an acetophenone-based initiator, and at least one among a thioxanthone-based initiator, an oxime-based initiator, and a benzophenone-based initiator, wherein a weight percent of the acetophenone-based initiator is larger than a weight percent of at least one among the thioxanthone-based initiator, the oxime-based initiator, and the benzophenone-based initiator, and a photo-polymerization compound.

14. The display device of claim 13, wherein the acetophenone-based initiator is 50 wt % or more for the total content of the photo-polymerization initiator.

* * * * *